(12) United States Patent
Goenka

(10) Patent No.: US 6,327,149 B1
(45) Date of Patent: Dec. 4, 2001

(54) ELECTRICAL CIRCUIT BOARD AND METHOD FOR MAKING THE SAME

(75) Inventor: Lakhi Nandlal Goenka, Ann Arbor, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/655,558

(22) Filed: Sep. 6, 2000

(51) Int. Cl.[7] ................................................ H05K 7/20
(52) U.S. Cl. .................... 361/720; 361/704; 361/707; 361/708; 361/719; 361/761; 174/16.3; 62/3.2; 428/325
(58) Field of Search .................... 361/688, 689, 361/699, 701, 702, 704, 705, 707, 708, 711, 715, 719, 720, 761–764; 165/80.2, 80.4, 80.5, 185; 174/15.1, 16.1, 16.3; 257/712, 717; 62/3.2, 3.7, 259.2

(56) References Cited

U.S. PATENT DOCUMENTS

| 3,801,388 | | 4/1974 | Akiyama et al. . | |
|---|---|---|---|---|
| 4,404,059 | | 9/1983 | Livshits et al. . | |
| 5,040,381 | * | 8/1991 | Hazen | 62/3.2 |
| 5,500,785 | * | 3/1996 | Funada | 361/720 |
| 5,508,885 | * | 4/1996 | Ishimoto | 361/720 |
| 5,637,921 | * | 6/1997 | Burward-Hoy | 257/712 |
| 5,645,123 | * | 7/1997 | Doi et al. | 361/719 |
| 5,738,797 | | 4/1998 | Belke, Jr. et al. . | |
| 5,921,087 | * | 7/1999 | Bhatia et al. | 62/3.2 |
| 5,943,216 | * | 8/1999 | Schmidt | 361/761 |
| 6,164,076 | * | 12/2000 | Chu et al. | 62/3.7 |
| 6,196,002 | * | 3/2001 | Newman et al. | 361/719 |
| 6,219,237 | * | 4/2001 | Geusic et al. | 361/699 |

* cited by examiner

Primary Examiner—Leo P. Picard
Assistant Examiner—Boris L. Chervinsky
(74) Attorney, Agent, or Firm—Visteon Global Tech. Inc.

(57) ABSTRACT

A multi-layer circuit board with a thermoelectric or "Peltier" cooler and a method forming a multi-layer circuit board with a thermoelectric or "Peltier" cooler is disclosed. The circuit board includes a thermoelectric cooler which is integrally formed within the circuit board and which is effective to efficiently absorb and dissipate heat from the circuit board.

18 Claims, 1 Drawing Sheet

ELECTRICAL CIRCUIT BOARD AND METHOD FOR MAKING THE SAME

FIELD OF INVENTION

The present invention relates to a method for making an electrical circuit board and more particularly, to a method for making a multi-layer electrical circuit board having a thermoelectric or "Peltier" cooler which is integrally formed within the circuit board and/or through various portions of the circuit board and which allows heat emanating from components which are contained within the circuit board to be efficiently dissipated.

BACKGROUND OF THE INVENTION

Multi-layer circuit boards contain and/or include electrical components which selectively and operatively populate opposed first and second surfaces (i.e., top and bottom surfaces) of each board (or other respective interior portions of each board), thereby desirably allowing each of the electrical circuit boards to contain and/or include a relatively large amount of electrical components which efficiently and densely populate the respective boards.

Because many components densely populate these circuit boards, during use and/or operation of the circuit boards, substantial amounts of heat are produced and/or generated within small areas of the circuit boards. This generated heat undesirably prevents the components from properly functioning and may even irrevocably damage or destroy these components. Therefore it in desirable to form, create and/or manufacture circuit boards that are adapted to disperse and/or dissipate heat away from such heat producing components.

Cooling devices, such as thermoelectric or "Peltier" coolers, may be used to disperse, dissipate and/or translate heat within electrical equipment, components and assemblies. Thermoelectric or "Peltier" coolers operate on the principle that passing current through two joined and dissimilar electric conductors causes heat to be emitted or absorbed at the juncture of the materials. Conventional or "external" thermoelectric coolers have been placed in and/or attached to electronics equipment, and more particularly, to warm or heat emitting portions the electronic equipment in order to cool the equipment. 3n thin manner, these "external" thermoelectric coolers dissipate and/or transfer heat away from the warm or heat emitting portions of the electronic equipment to cooler regions of the electronic equipment.

One drawback associated with these conventional or "external" thermoelectric coolers is that they typically comprise additional materials or components that are not needed for the functioning of the electronic equipment to which the coolers are attached. Employing "external" thermoelectric coolers which use additional materials or components is especially undesirable in multi-layer circuit boards which are designed to support and/or contain several electrical components in a relatively small amount of space. For example and without limitation, such additional materials and/or components would add both unwanted size and weight to multi-layer circuit boards.

Consequently, there is a need for circuit boards created by a method which allows many small electrical components to densely populate respective layers within the circuit boards, while still allowing heat to be dissipated and/or dispersed away from components which emit substantial amounts of heat. Specifically, there is a need for a method of creating thermoelectric or "Peltier" type coolers within multi-layer circuit boards wherein the thermoelectric or "Peltier" type coolers are integrally formed within the circuit board such that no or very little excess material is needed to create the coolers.

SUMMARY OF THE INVENTION

It is a first object of the present invention to provide a method for forming thermoelectric coolers within multi-layer circuit boards which overcome the various previously delineated drawbacks of conventional thermoelectric coolers.

It is a second object of the present invention to provide thermoelectric coolers that are integrally and substantially manufactured from the original materials that are used when making a multi-layer circuit board.

It is a third object of the present invention to provide a multi-layer circuit board including integrated thermoelectric coolers which allow heat energy to be efficiently and repeatedly transferred or dissipated from warmer areas of the circuit board.

According to a first aspect of the present invention, a multi-layer circuit board is provided. The multi-layer circuit board includes a first circuit portion in which an amount of heat is generated; a second circuit portion which is attached to the first circuit portion, the second circuit portion including a first conductive layer which is joined to a second conductive layer, and a generally elongated member which is integrally formed within the first and second conductive layers; first and second terminals which are respectively coupled to first and second ends of the generally elongated member; and an electrical power source which is selectively coupled to the first and the second terminals and which is effective to selectively apply a voltage to the first and second terminals, the voltage being effective to induce a thermoelectric cooling effect within the generally elongated member, thereby causing the amount of heat to be absorbed by the generally elongated member.

These and other objects, aspects, and advantages of the present invention will become apparent upon reading the following detailed description in combination with the accompanying drawings.

BRIEF DESCRIPTION OF THE DRAWINGS

FIG. 1(*a*) is a bottom view of the circuit board assembly shown in FIG. 1 taken in the direction of view line 1*a*—1*a*.

DETAILED DESCRIPTION OF THE PREFERRED EMBODIMENT OF THE INVENTION

Figure 1:
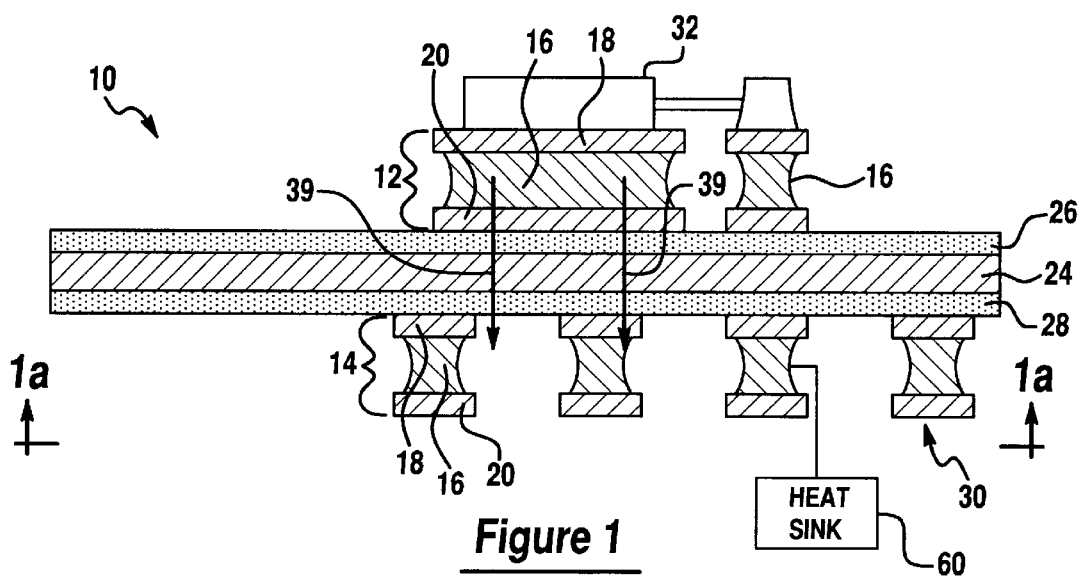
FIG. 1 in a partial sectional view of a circuit board assembly formed in accordance with the teachings of the present invention.

Referring now to FIGS. 1 and 1(*a*), there is shown a multi-layer electrical circuit board 10 which is made or formed in accordance with a preferred embodiment of the present invention and which includes an integrated thermoelectric or "Peltier" type cooler 30. While FIGS. 1 and 1(*a*) illustrate only portions of circuit board 10 and a single thermoelectric cooler 30, the concept and/or steps of the method or process of the present invention may be used on an entire circuit board which may include several integrated thermoelectric type coolers.

Referring now to FIG. 1, circuit board 10 includes a pair of pre-circuit assemblies or portions 12, 14, which each comprises a conventional etched tri-metal ("ETM") type assembly. Particularly, each pre-circuit assembly 12, 14 includes a core metal portion, layer or member 16 which is disposed between a pair of electrically conductive portions layers or members 18, 20 which are respectively coupled to first and second or "top" and "bottom" surfaces of members 16. In one non-limiting embodiment of the invention, core members 16 are each made from a conventional aluminum material and members 18, 20 ate each made from a conventional copper material. While copper and aluminum are used to form pre-circuit assemblies 12 and 14 in the preferred embodiment of the invention, it should be appreciated that other metals and metal combinations can be used to form pre-circuit assemblies 12, 14 and all of the other circuit board assemblies and portions described herein, and may include metals such an iron, nickel, silver, gold, tin and alloys thereof.

Pre-circuit assemblies 12, 14 may be formed, provided and/or manufactured in a variety of known and conventional manners. In one preferred embodiment, pre-circuit assemblies 12, 14 are formed and/or manufactured by conventionally attaching, bonding and/or adhering members 18, 20 to the top and "bottom" surfaces of core metal portions 16, and then selectively removing portion of the members 16, 18 and 20 in a conventional manner (e.g., by chemical etching) to form assemblies 12, 14.

After pre-circuit assemblies 12, 14 have been formed, they are attached and/or coupled to a core member or ground layer 24. Core member 24 is preferably manufactured from a copper or other conductive material. In the non-limiting embodiment shown in FIG. 1, pre-circuit assemblies 12, 14 are attached to core member 24 through the use of conventional adhesive and/or dielectric layers 26, 28. In one particular non-limiting embodiment, pre-circuit assemblies 12, 14 are adhesively secured to core member 24 by conventional and commercially available adhesive layers 26, 28 through the use of a one-step laminating process. In other alternate embodiments, assemblies 12, 14 may be selectively etched after being attached to core member 24.

Figure 1A:
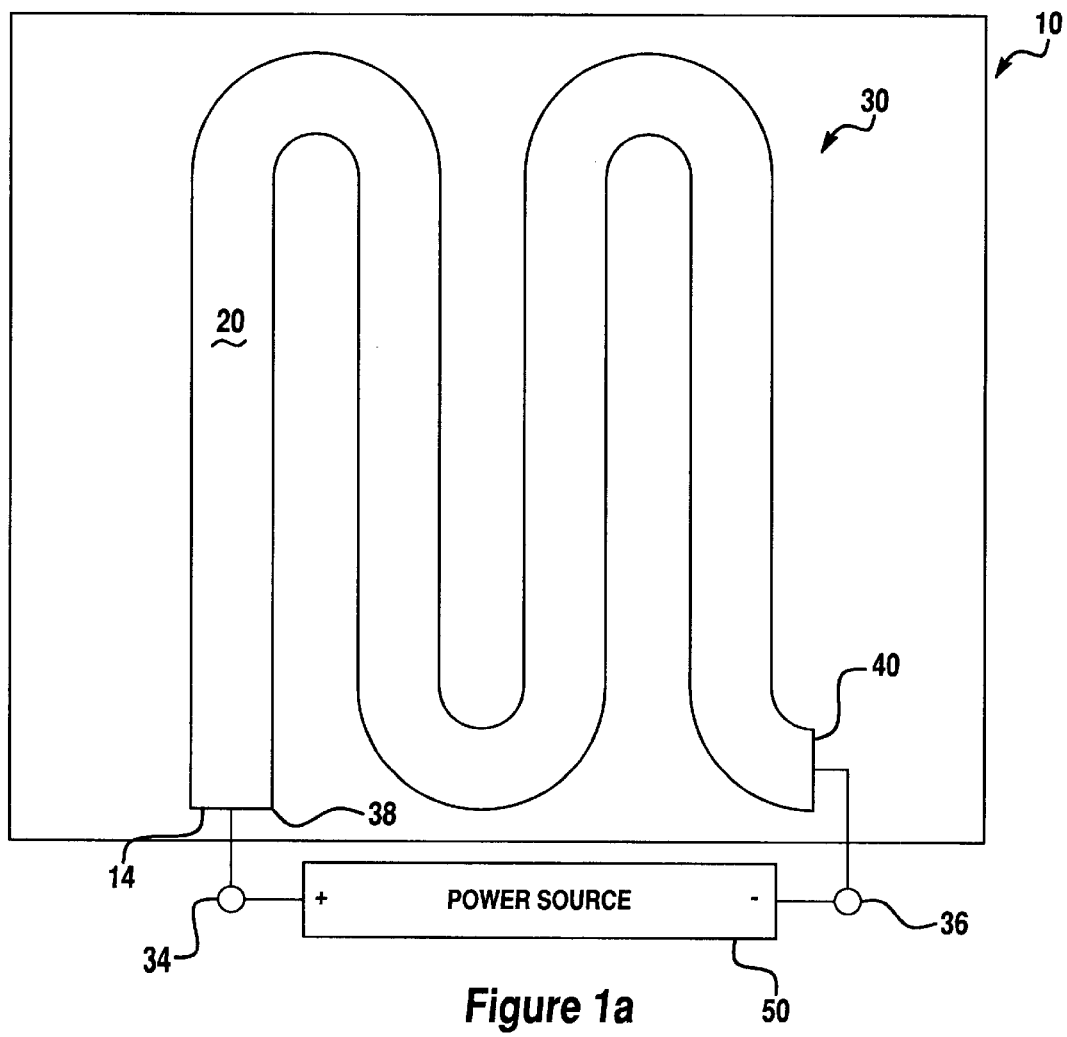

In the preferred embodiment of the invention, thermoelectric cooler 30 is generally elongated and integrally formed within pre-circuit assembly 14 and comprises the portion of pre-circuit assembly 14 which is illustrated in FIGS. 1 and 1a. As shown, thermoelectric cooler 30 has a relatively narrow, elongated and generally "S"-shaped configuration. Thermoelectric cooler 30 extends or traverses across a portion of circuit board 10 and in at least partially disposed in relative close proximity to a heat-generating power device 32. Particularly, a portion of thermoelectric cooler 30 is disposed directly below heat-generating power device 32 which is attached to the conductive layer 18 of circuit assembly 12. In one non-limiting embodiment, thermoelectric cooler 30 extends through other portions of circuit board 10 and may be formed in a variety of geometric shapes and sizes.

A pair of conventional electrical terminals or leads 34, 36 are operatively coupled to the opposing ends 38, 40 of thermoelectric cooler 30. Particularly, leads 34, 36 are attached to each layer 16, 18 and 20. In alternate embodiments, terminals 34, 36 are attached to layer 16 and only one of layers 18, 20. In other alternate embodiments, separate pairs of terminals or leads may be attached to each layer 16, 18 and 20.

In operation, terminals 34, 36 are attached to a controlled and/or variable source of electrical power 50. The electrical power source 50 is then used to selectively and controllably apply varying electrical potential or voltage differences to the individual layers 16, 18 and 20 (e.g., the aluminum and copper layers) of thermoelectric cooler 30. The applied varying potential differences generate a current through the dissimilar conductors of layer 16 and layers 18, 20. This selectively generated current produces relatively large heat fluxes within circuit board 10 and causes heat generated from device 32 to travel in the directions of arrows 39 and to be absorbed at the junctions of layers 16, 18 and 20. These heat fluxes are effective to quickly absorb heat from areas near heat-generating power device 32 and to quickly purge or transfer heat to other "cooler" areas of the circuit board 10, thereby dissipating the generated heat. heat. Importantly, the thermoelectric cooler 30 is integrally formed within the circuit board 10, does not require additional materials, and can be selectively formed (e.g., etched) in a conventional manner during the ordinary course of multi-layer (e.g., ETM) circuit board processing.

In one non-limiting embodiment, a conventional heat sink 60 is coupled to thermoelectric cooler 30 in a conventional manner and is effective to purge and/or release the heat absorbed by thermoelectric cooler 30. In other non-limiting embodiments, thermoelectric cooler 30 may be used in combination with other heat management systems or devices such as heat pipes, heat pumps and other thermoelectric coolers.

In alternate embodiments, different varying voltages may be applied to each layer 16, 18, and 20, and may be controlled or varied based upon the beat absorption requirements of the circuit board 10 or of the portion of the circuit board 1a that contains device 32. In other alternate embodiments, thermoelectric cooler 30 may include and/or be integrally formed from fewer, additional or different layers or members. For example and without limitation, in one non-limiting embodiment, thermoelectric cooler 30 may include and/or be integrally formed from only a copper layer and an aluminum layer. Additionally, core member 24 and pre-circuit assemblies 12, 14 may also include different, fewer, or additional layers.

It should be understood that this invention is not to be limited to the exact construction or embodiment described above but that various changes may be made without departing from the spirit or scope of the invention.

What is claimed is:

1. A multi-layer circuit board comprising:

a first ETM circuit portion in which an amount of heat is generated;

a second ETM circuit portion which is attached to said first ETM circuit portion, said second ETM circuit portion including a first conductive layer and a second conductive layer which is joined to said first conductive layer, and a generally elongated member which is integrally formed within said first and second conductive layers;

first and second terminals which are respectively coupled to first and second ends of said generally elongated member; and an electrical power source which is selectively coupled to said first and second terminals and which is effective to selectively apply a voltage to said first and second terminals, said voltage being effective to induce a thermoelectric cooling effect within said generally elongated member, thereby causing said amount of heat to be absorbed by said generally elongated member.

2. The multi-layer circuit board of claim 1 wherein said first conductive layer is made from an aluminum material and said second conductive layer is made from a copper material.

3. The multi-layer circuit board of claim 2 wherein said second ETM circuit portion further comprises a third conductive layer which is attached to said first conductive layer and which forms a portion of said generally elongated member.

4. The multi-layer circuit board of claim 3 wherein said third conductive layer is made from a copper material.

5. The multi-layer circuit board of claim 1 wherein said generally elongated member is generally "S"-shaped.

6. The multi-layer circuit board of claim 1 further comprising a heat sink which is operatively attached to said generally elongated member and which is effective to purge said amount of absorbed heat from said generally elongated member.

7. The multi-layer circuit board of claim 1 further comprising a core member which is disposed between said first ETM circuit portion and said second ETM circuit portion; and an adhesive material which is applied to a top surface and a bottom surface of said core member and which is used to respectively attach said first ETM circuit portion and said second ETM circuit portion to said top and bottom surfaces of said core member.

8. A multi-layer circuit board assembly comprising:

a first pre-circuit assembly;

a component which is attached to said first pre-circuit assembly and which generates an amount of heat;

a second pre-circuit assembly which is attached to said first pre-circuit assembly, said second pre-circuit assembly including core layer having a first and a second surface and first and second conductive layers which are respectfully attached to said first and second surface, said second pre-circuit assembly further including a generally elongated member which is integrally formed within said first and second conductive layers and said core layer and which has a first end and a second end;

a second core member which is disposed between and attached to said first pre-circuit assembly and said second pre-circuit assembly; and a variable electrical power source which is operatively coupled to said first end and said second end of said elongated member, said variable electrical power source being effective to selectively apply an electrical potential difference to said generally elongated member, said electrical potential difference being effective to generate current within each of said layers of said generally elongated member, thereby creating a thermoelectric cooling effect within said generally elongated member and causing said generally elongated member to absorb said amount of heat.

9. The multi-layer circuit board of claim 8 wherein said generally elongated member is formed by an etching process.

10. The multi-layer circuit board of claim 8 further comprising a second core member which is disposed between and attached to said first pre-circuit assembly and said second pre-circuit assembly.

11. The multi-layer circuit board of claim 8 further comprising a heat sink which is operatively coupled to said generally elongated member and which is effective to purge said amount of heat which is absorbed by said generally elongated member.

12. The multi-layer circuit board of claim 8 wherein said generally elongated member is generally "S"-shaped.

13. The multi-layer circuit board assembly of claim 8 wherein said core layer is made from an aluminum material and wherein said first and second conductive layers are made from a copper material.

14. A method for removing an amount of heat from a multi-layer circuit board of the type including a first ETM circuit portion in which said amount of heat is generated and a second ETM circuit portion which is attached to said first ETM circuit portion and which includes a first conductive member which is joined with a second conductive member, said method comprising the steps of:

selectively and integrally forming a cooling member within said first and second conductive members of said second ETM circuit portion; and selectively applying a voltage to said first and second conductive members, effective to cause current to pass through said first and second conductive members and to induce a thermoelectric cooling effect within said cooling member, thereby absorbing said amount of heat.

15. The method of claim 14 wherein said cooling member is formed by an etching process.

16. The method of claim 15 wherein said cooling member is generally "S"-shaped.

17. The method of claim 16 wherein said first conductive member is made from an aluminum material and said second conductive member is made from a copper material.

18. The method of claim 17 further comprising the step of:

providing a heat sink; and coupling said heat sink to said cooling member, thereby causing said heat sink to purge said amount of heat which is absorbed by said cooling member.

* * * * *